United States Patent
Huntington

(10) Patent No.: US 9,847,441 B2
(45) Date of Patent: Dec. 19, 2017

(54) DOPED MULTIPLIER AVALANCHE PHOTODIODE

(71) Applicant: Voxtel, Inc., Beaverton, OR (US)

(72) Inventor: Andrew Huntington, Aloha, OR (US)

(73) Assignee: Voxtel, Inc., Beaverton, OR (US)

( * ) Notice: Subject to any disclaimer, the term of this patent is extended or adjusted under 35 U.S.C. 154(b) by 0 days.

(21) Appl. No.: 14/813,475

(22) Filed: Jul. 30, 2015

(65) Prior Publication Data

US 2017/0033253 A1    Feb. 2, 2017

(51) Int. Cl.
*H01L 31/107*  (2006.01)
*H01L 27/146*  (2006.01)

(52) U.S. Cl.
CPC .... *H01L 31/1075* (2013.01); *H01L 27/14643* (2013.01); *H01L 27/14689* (2013.01)

(58) Field of Classification Search
CPC ........... H01L 31/1075; H01L 27/14643; H01L 27/14689
See application file for complete search history.

(56) References Cited

U.S. PATENT DOCUMENTS

| | | | |
|---|---|---|---|
| 6,747,296 B1 * | 6/2004 | Clark | H01L 31/107 257/186 |
| 7,432,537 B1 * | 10/2008 | Huntington | B82Y 20/00 257/186 |
| 2013/0221193 A1 * | 8/2013 | Williams | H01L 31/107 250/206 |

OTHER PUBLICATIONS

Ning Duan, Shuling Wang, Feng Ma, Ning Li, Joe C. Campbell, Chad Wang, and Larry A. Coldren, High-Speed and Low-Noise SACM Avalanche Photodiodes With an Impact-Ionization-Engineered Multiplication Region, IEEE Photonics Technology Letters, vol. 17, No. 8, Aug. 2005.*

* cited by examiner

*Primary Examiner* — Mark Tornow

(57) ABSTRACT

An epitaxial grown avalanche photodiode (APD), the avalanche photodiode comprising an anode, a cathode, an absorber, and a doped multiplier. The absorber and the doped multiplier are about between the cathode and the anode. The doped multiplier has a multiplier dopant concentration. The doped multiplier substantially depleted during operation of the epitaxial grown photodiode. The doped multiplier may comprise of a plurality of multiplication regions, each of the multiplication regions substantially depleted during operation of the avalanche photodiode.

17 Claims, 8 Drawing Sheets

DOPED MULTIPLIER AVALANCHE PHOTODIODE

TECHNICAL FIELD

The present disclosure relates in general to avalanche photodiodes (APD). The disclosure relates in particular to low light sensitive short wavelength infrared (SWIR) APDs.

BACKGROUND INFORMATION

Avalanche photodiodes (APDs) are highly sensitive optical detectors. Avalanche photodiodes are reverse biased solid state devices. When a photon is absorbed in the device, an electron-hole pair is created. The mobile charge carriers accelerate through the semiconductor material due to the high electric field in the junction, generating more carriers via impact ionization. These secondary carriers also accelerate and impact-ionize, generating even more carriers, resulting in an avalanche. This process is called avalanche multiplication, and such devices can operate either with linear gain such that the average number of electrons generated is proportional to the average number of photons receiver, or when biased above a critical voltage, may enter a breakdown state in which the very large number of electrons generated is unrelated to the number of photons received. This invention pertains to APDs designed for linear mode operation.

SUMMARY OF THE DISCLOSURE

An epitaxial grown avalanche photodiode, the avalanche photodiode comprising an anode, a cathode, an absorber, and a doped multiplier. The absorber and the doped multiplier are about between the cathode and the anode. The doped multiplier region has a multiplier dopant concentration. The doped multiplier region substantially depleted during operation of the epitaxial grown photodiode. The doped multiplier may comprise of a plurality of multiplication regions, each of the multiplication regions substantially depleted during operation of the avalanche photodiode.

BRIEF DESCRIPTION OF THE DRAWINGS

The accompanying drawings, which are incorporated in and constitute a part of the specification, illustrate preferred methods and embodiments of the present disclosure. The drawings together with the general description given above and the detailed description of preferred methods and embodiments given below, serve to explain principles of the present disclosure.

DETAILED DESCRIPTION OF EMBODIMENTS

Figure 1A:
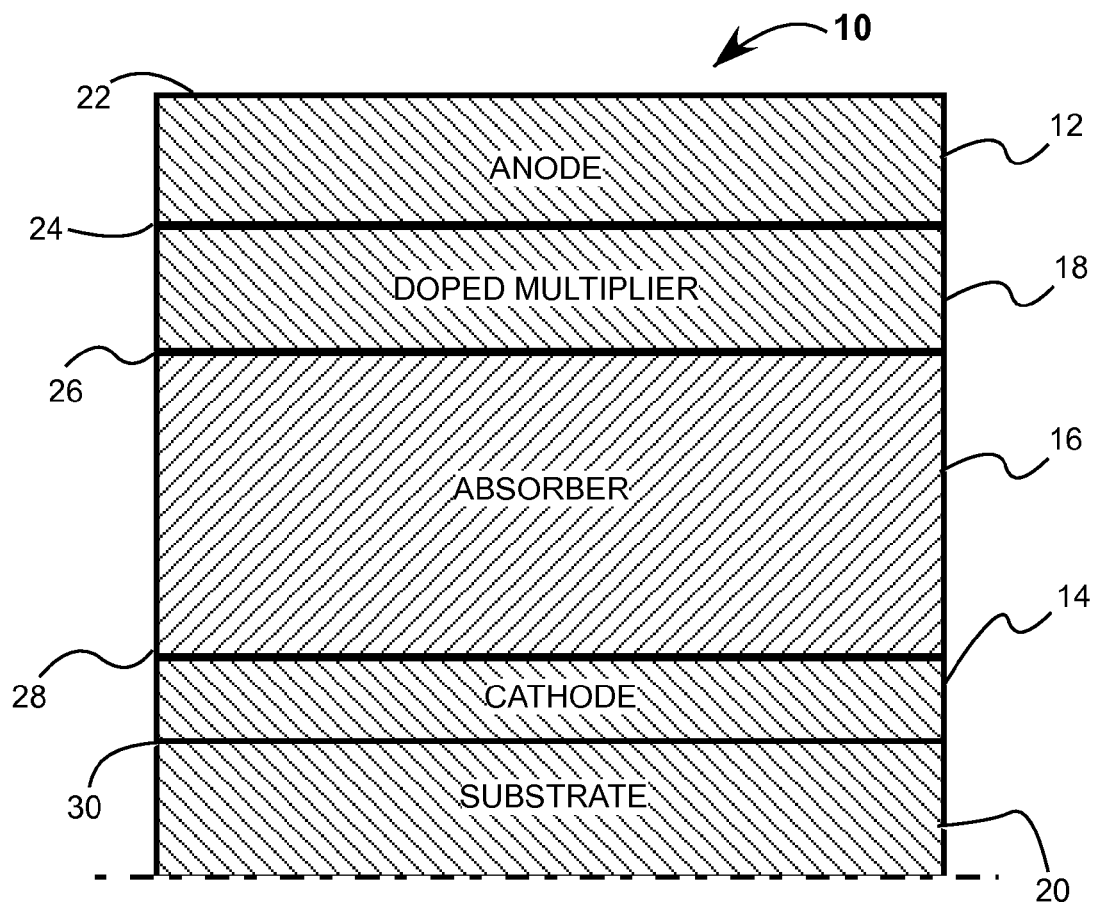
FIG. 1A is a cross-section view of an epitaxial grown avalanche photodiode, the avalanche photodiode comprising an anode, a cathode, an absorber, and a doped multiplier, the doped multiplier region having a multiplier dopant concentration, the doped multiplier region substantially depleted during operation, and wherein the absorber and the doped multiplier are about between the cathode and the anode.

Referring now to the drawings, wherein like components are designated by like reference numerals. Methods and various embodiments of the present invention are described further hereinbelow.

Within the present disclosure a semiconductor avalanche photodiode is disclosed. The avalanche photodiode may reference elements, layers, and regions which may be drawn with strict borders defining the extent of such areas. Such drawing are for illustrative purposes only. In practice, those regions may be strict or graded, transitioning in properties between the different areas. Likewise, the present disclosure refers to dopant levels and concentrations. In the art, dopant concentration is sometimes referred as intentionally doped and unintentionally doped. Within the present disclosure, dopants concentrations are only referenced when intentionally doped, the dopant concentrations levels in measurable and controllable quantities, but further recognizing that areas can have unintentional minute dopant levels due to practical constraints and variations in materials and fabrication processes used in fabricating the avalanche photodiode.

Referring to FIG. 1A, an avalanche photodiode 10 comprises of an anode 12, a cathode 14, an absorber 16, and a doped multiplier 18. Absorber 16 and doped multiplier 18 are about between cathode 14 and anode 12. Here, anode 12 has a first surface 22 and is adjacent to doped multiplier 18, the avalanche photodiode having an anode-multiplier interface 24. Doped multiplier 18 is adjacent to absorber 16, the avalanche photodiode having a multiplier-absorber interface 26. Absorber 16 is adjacent to cathode 14, via an absorber-cathode interface 28. Cathode 14 is adjacent to a substrate 20, having a cathode-substrate interface 30. The cathode layer is formed by doping the substrate. In other embodiments the substrate is the cathode. Further, in a reversed structure, the substrate may be the anode.

Doped multiplier 18 has a multiplier dopant concentration, the doped multiplier substantially depleted during operation. In general, the doped multiplier can have a multiplier dopant concentration profile that is about constant, stepped, continuously changing, or combinations thereof within the doped multiplier region as long as the doped multiplier dopant concentration and the reverse-bias provided during operation causes an asymmetric electrical field, as measured down the axis of the avalanche photodiode. The asymmetric electric field has electric field strength low on one side of the multiplier and high on the other side of the multiplier causing enhanced contrast in ionization rates between carriers relative to the natural contrast in ionization rates obtained in a bulk sample of a given semiconductor alloy with about constant internal electric field strength. The enhanced contrast in ionization rates reduces the excess noise factor which characterizes the variance of the APD's multiplied photocurrent relative to the variance which would be observed if the avalanche gain was a constant rather than a random variable. Here, the reverse-bias applied across the avalanche photodiode and the asymmetric electric field provides greater gain to holes than to electrons.

Absorber 16 can be doped or undoped. When high bandwidth operation is not a requirement, doping the absorber reduces the equilibrium population of minority carriers which feed thermal dark current. Doping also alleviates penetration of strong electric fields from the junction into the absorber, which can generate dark current by tunneling. Additionally, and discussed further hereinbelow, grading the doping across the absorber can generate a weak electric field and improve collection efficiency of photocarriers by the multiplier.

During operation, a reverse bias applied across the and the cathode substantially depletes the doped multiplier. The combination of the reverse bias and the doped multiplier creates an asymmetric electrical field across the doped multiplier.

The avalanche photodiode can be manufactured using commercially available semiconductor fabrication processes. Such processes comprising physical vapor deposition (PVD), chemical vapor deposition (CVD), metal organic chemical vapor deposition (MOCVD), molecular beam epitaxy (MBE), liquid phase epitaxy (LPE), vapor phase epitaxy (VPE), atomic layer deposition (ALE), or combinations thereof.

In general, steps of manufacturing the avalanche photodiode comprise: providing or forming either the anode or the cathode layer, forming either the doped multiplier layer or the absorber layer, forming either the multiplier or the absorber layer not previously formed, then forming either the anode of the cathode layer not previously provided. Other layers and features, such as a graded transition layer, a charge layer (also termed a field control layer), a buffer layers, a diffusion blocking layer, a contact layers and other such commonly used features can be incorporated within or on the avalanche photodiode. Further the avalanche photodiode can be pixelated either by physically etching away the epitaxially-grown semiconductor layers outside the footprint of a patterned pixel, or by patterning the diffusion of dopants to form either the anode or cathode of a pixel.

A variety of semiconductor materials can be used to make the avalanche photodiode. For instance the doped multiplier can be made from the group of semiconductor alloys comprising binary compounds such as indium arsenide (InAs), gallium arsenide (GaAs), aluminum arsenide (AlAs), indium phosphide (InP), gallium phosphide (GaP), aluminum phosphide (AlP), indium antimonide (InSb), gallium antimonide (GaSb), aluminum antimonide (AlSb), and ternary or quaternary compounds formed by alloying combinations of those binary compounds. The substrate that the device is grown on can be GaAs, InP, InSb, silicon (Si), or other crystalline or non-crystalline materials suitable for epitaxial growth of semiconductor thin films, including those with buffer layers that accommodate lattice mismatches between substrate and epitaxial layers.

The dopants used depend on the layer and the avalanche photodiode device structure. Suitable p-type dopants include the group comprising beryllium (Be), carbon (C), magnesium (Mg), zinc (Zn), cadmium (Cd), silicon (Si), and germanium (Ge). Suitable n-type dopants include the group comprising sulfur (S), selenium (Se), tellurium (Te), silicon (Si), and germanium (Ge). Some dopant elements like Si are amphoteric in some compound semiconductors like GaAs, acting as either a donor or an acceptor depending upon which lattice site the dopant atom occupies. Silicon predominantly acts as an n-type dopant in the semiconductor compounds from which the preferred embodiments of this disclosure are fabricated.

Figure 1B:
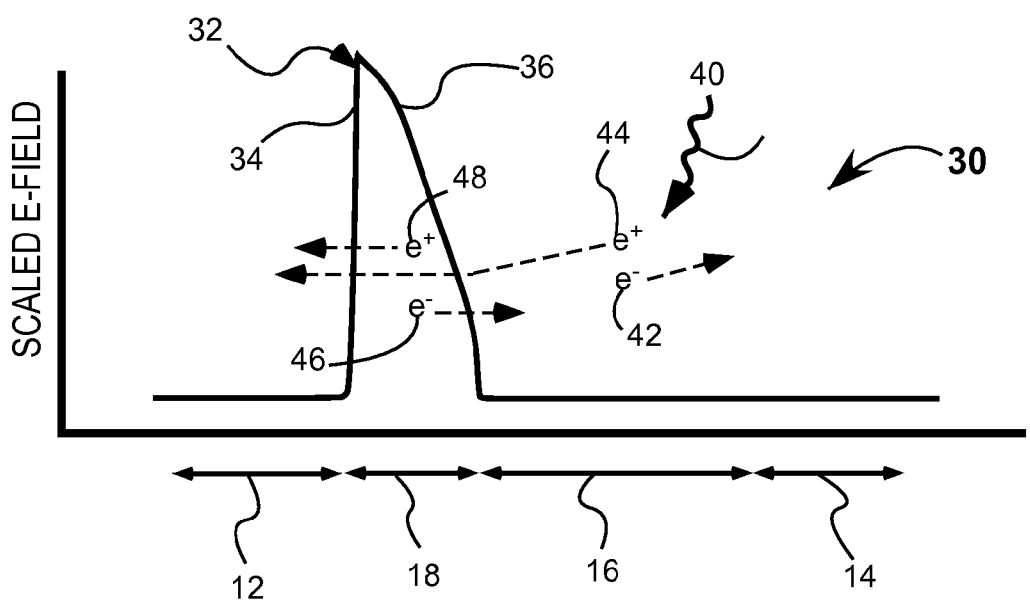
FIG. 1B is a scaled electric field graph vs device depth of the avalanche photodiode shown in FIG. 1A.

FIG. 1B shows a scaled electric field diagram 30 of the avalanche photodiode shown in FIG. 1A with the bias applied. The vertical axis is the scaled electric field and the horizontal axis provides approximate axial locations of the elements of the avalanche photodiode, the elements labeled with the same reference numerals as that shown in FIG. 1A. When bias is applied across anode 12 and cathode 14 an asymmetric electric field 32 has a fast rising edge 34 and slow decreasing edge 36 resembling an asymmetric "sawtooth" type geometry.

Explained operationally, a photon 40 enters absorber 16. The side the photon enters the avalanche photodiode depends on the avalanche photodiode design. Photon 40, having a wavelength within the absorption spectrum of the absorber, is absorbed within the absorber region and creates an electron-hole pair comprising a first electron 42 and a first hole 44. Here, hole 44 enters the strong electric field of the multiplier and accelerates, picking up sufficient energy to impact ionize, creating a second electron 46 and a second hole 48. Second electron accelerates in the multiplier toward cathode 14 through electric field 32, in the direction of decreasing electric field strength, thereby having, relative to the holes, decreased possibility of causing another impact ionization event. First hole 44 and second hole 46, both accelerate further in the multiplier toward anode 12, through electric field 32, in the direction of increasing electric field strength, thereby having, relative to the electrons, increased probability of causing another impact ionization event.

Figure 2A:
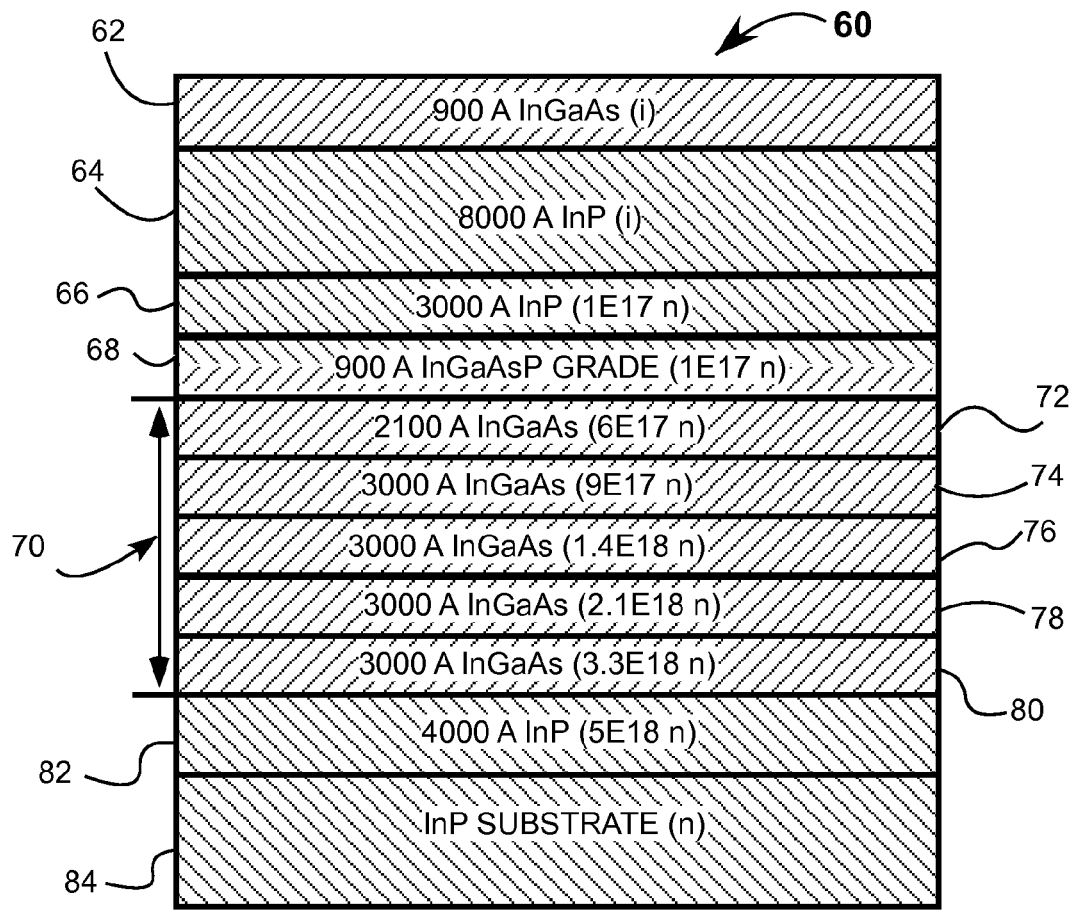
FIG. 2A is a cross-section view of the avalanche photodiode wherein the absorber is doped.
Figure 2B:
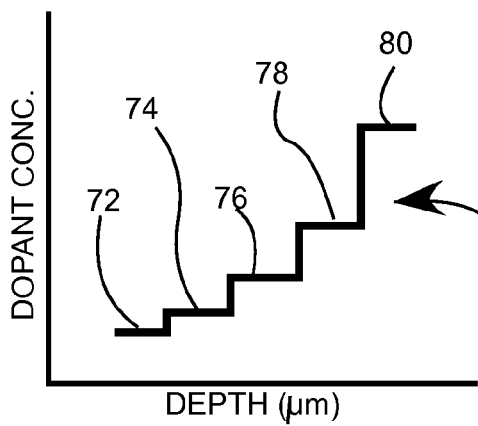
FIG. 2B is a graph of dopant concentration vs absorber depth wherein the absorber comprises of a plurality of doped layers.

FIG. 2A and FIG. 2B illustrate an avalanche photodiode 60, an exemplary embodiment of the present disclosure wherein the absorber is doped. Avalanche photodiode 60 has a diffusion block 62, the diffusion block an optional layer required for specific pixelating processes described further hereinbelow. Diffusion block 62 is about 900 angstroms (Å) of intrinsic InGaAs. Diffusion block 62 is adjacent to an anode 64, anode 64 is about 8000 Å of intrinsic IP. Anode 64 is adjacent to a doped multiplier 66. Doped multiplier 66 is about 3000 Å of InP with a doping level of about 1E17. A graded heterojunction 68 is between doped multiplier 66 and a doped absorber 70. Doped absorber 70 is adjacent to a cathode 82, the cathode about 4000 Å of InP with a dopant level of about 5E18.

Graded heterojunction 68 is a stepped heterojunction that changes material composition between the different semiconductor materials used for the doped multiplier and the doped absorber region. Here, the graded heterojunction is about 900 Å of InGaAsP with a doping level of about 1E17, the graded heterojunction changing in composition between the multiplier InP material and the doped absorber InGaAs material.

Doped absorber 70 has an absorber doping concentration profile 90, the absorber doping concentration profile decreasing in the direction of the doped multiplication region. During operation the doped absorber remains substantially undepleted during operation. Here, doped absorber 70 is InGaAs with a plurality of dopant stepped layers. Doped absorber 70 has a doped absorber layer 72, 74, 76, 78, and 80 with dopant concentration of 6E17, 9E17, 1.4E18, 2.1E18, and 3.3E18 respectively. Doped absorber layer 72 has a thickness of about 2100 Å of InGaAs, while the remaining doped absorber layers each have a thickness of about 3000 Å of InGaAs. The plurality of doped absorber layers effectively cause the absorber doping concentration profile to approximate an exponentially decreasing function. During operation, the exponentially decreasing function generates a weak electric field. In another embodiment, the doped absorber can be comprise of a smooth dopant profile.

Figure 2C:
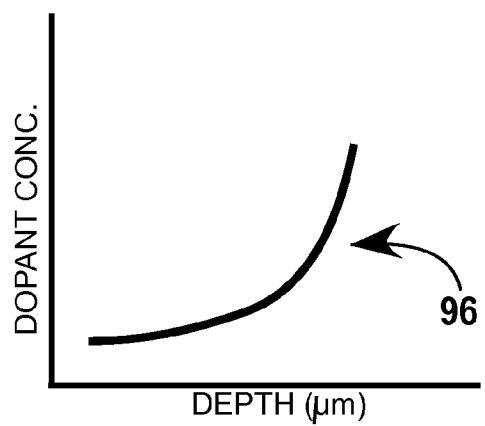
FIG. 2C is a graph of dopant concentration vs absorber depth wherein the dopant concentration profile is smooth.

FIG. 2C illustrates a smooth absorber dopant profile 96. A smooth dopant profile can be obtained in the doped absorber by altering the dopant process during epitaxial growth. For instance, if the APD layers are grown by MBE, linearly decreasing the temperature of the dopant effusion cell during epitaxial growth causes an approximately exponentially decreasing dopant concentration in the doped layer being formed.

Figure 3:
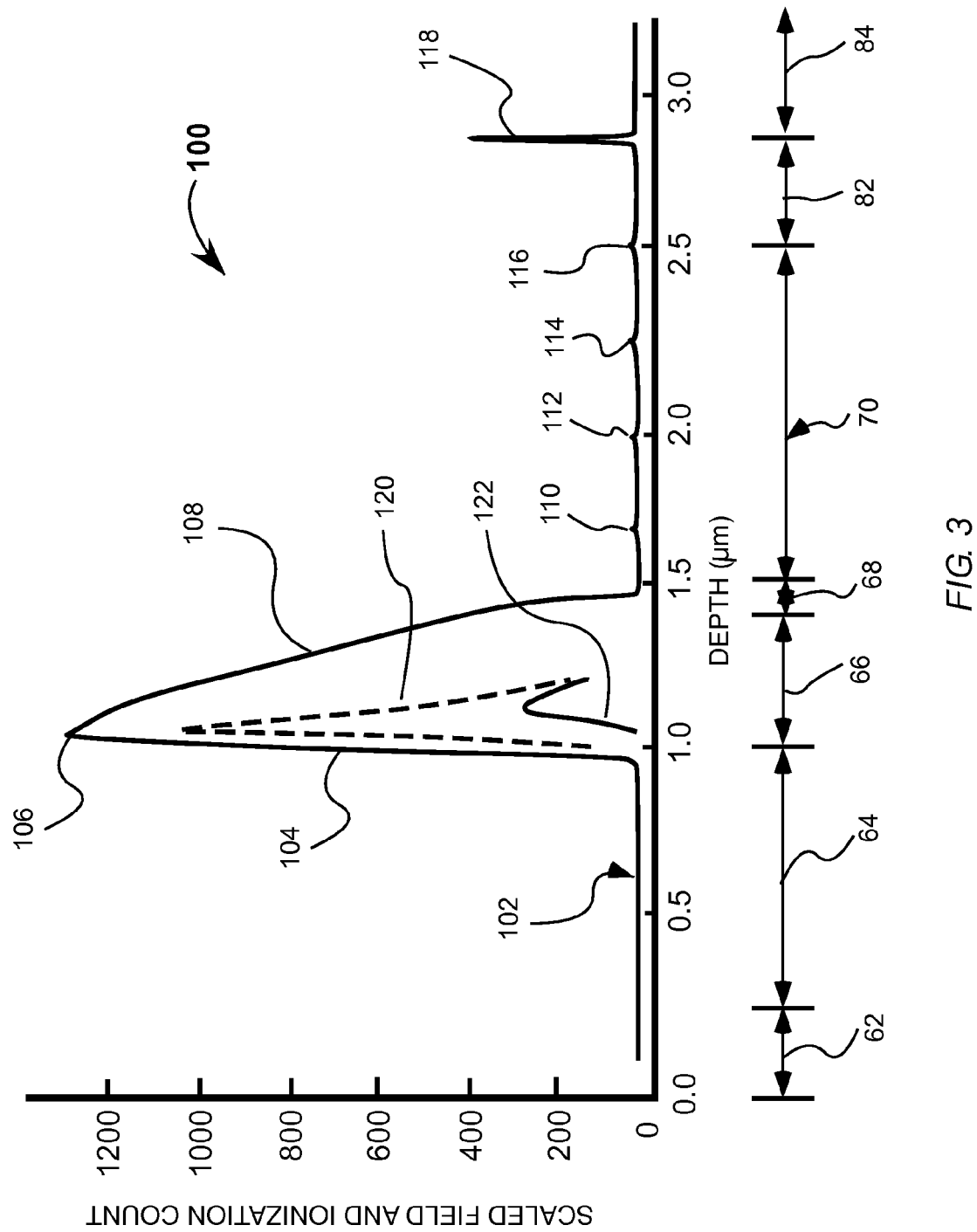
FIG. 3 is a graph showing a scaled field and an ionization count versus device depth of the avalanche photodiode shown in FIG. 2A.

FIG. 3 is a graph 100 showing a scaled field and an ionization count versus depth below the surface of the epitaxial layer structure of the avalanche photodiode as that seen in FIG. 2A, wherein the doped absorber has a plurality of stepped layers. The same reference numerals as those used in FIG. 2 are used to indicate areas or regions along the depth axis. Here an electric field 102 indicates an undepleted region along either side of substantially depleted multiplication region 66. In this configuration, holes drift left and electrons drift right.

The electric field is effectively zero along the undepleted volume of the anode, rises sharply 104 to a peak 106 along the small span of the anode that is depleted, declines 108 along the doped multiplier 66, and transitions to a weak electric field along the absorber region 70. The electric field is characterized by an asymmetric profile causing contrast in ionization rates. A hole ionization count 120 compared to an electron ionization count 122 is at least multiple times greater than electron ionization count 122 within the asymmetric electric field profile. Along absorber region 70, electric field 102 has a plurality of minor electric field spikes 110, 112, 114, 116 due to the transition between the stepped dopant concentrations. Another minor electric field spike 118 is due to the transition between cathode 82 and substrate 84.

One figure of merit to compare avalanche photodiodes is the excess noise factor (F). The excess noise factor is the ratio of the variance of multiplied photocurrent to the variance which would be measured in the case of deterministic rather than random gain. The excess noise factor can be modeled by McIntyre's equation:

$$F = M\left[1 - (1-k)\left(\frac{M-1}{M}\right)^2\right],$$

where k is the carrier ionization rate ratio and M is the mean avalanche gain. In general the carrier ionization ratio is preferably small. A conventional InGaAs SWIR avalanche photodiode has a carrier ionization ratio of about 0.2 to about 0.4 at a gain of 8. The table below shows the noise characteristics of the avalanche photodiode, shown in FIG. 2A, at various operating points in terms of gain (M), excess noise factor F, effective ionization rate ratio ($k_{eff}$), and maximum electric field strength ($E_{max}$):

| M | F | $k_{eff}$ | $E_{max}$ |
|---|---|---|---|
| 1.68 | 1.25 | −0.547 | 624 kV/cm |
| 1.93 | 1.31 | −0.378 | 645 kV/cm |
| 2.26 | 1.38 | −0.251 | 667 kV/cm |
| 2.79 | 1.48 | −0.137 | 688 kV/cm |
| 3.56 | 1.64 | −0.046 | 709 kV/cm |
| 5.07 | 1.91 | 0.032 | 730 kV/cm |
| 6.31 | 2.14 | 0.068 | 740 kV/cm |
| 8.47 | 2.52 | 0.097 | 751 kV/cm |

The table below shows noise characteristics of an avalanche photodiode similar to that shown in FIG. 2A, except without intentional multiplier doping:

| M | F | $k_{eff}$ | $E_{max}$ |
|---|---|---|---|
| 1.62 | 1.28 | −0.437 | 470 kV/cm |
| 1.97 | 1.41 | −0.184 | 492 kV/cm |
| 2.63 | 1.69 | 0.072 | 513 kV/cm |
| 3.71 | 2.00 | 0.137 | 535 kV/cm |
| 4.66 | 2.25 | 0.162 | 545 kV/cm |
| 6.21 | 2.67 | 0.194 | 556 kV/cm |
| 17.38 | 5.54 | 0.233 | 577 kV/cm |

Figure 4:
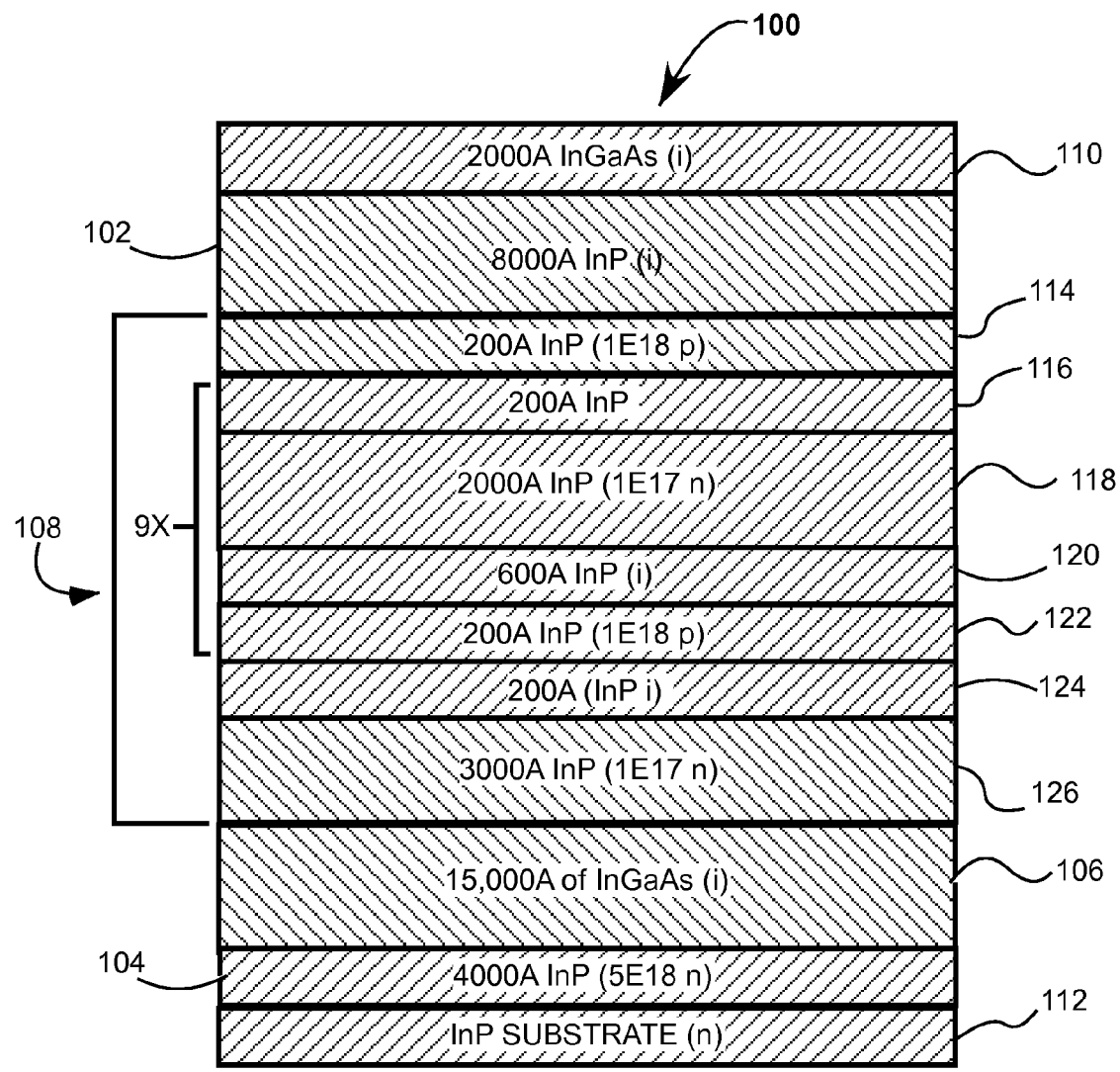
FIG. 4 is a cross section view of an avalanche photodiode comprising an anode, a cathode, an absorber, and a doped multiplier, the doped multiplier having a plurality of multiplying stages, at least one of the plurality of multiplying stages having a multiplier dopant concentration that is substantially depleted during operation, and wherein the absorber and the plurality of multiplying stages are about between the cathode and the anode.

FIG. 4 is an avalanche photodiode 100, another embodiment of the present disclosure. Avalanche photodiode has an anode 102, a cathode 104, an absorber layer 106, and a doped multiplier 108. Doped multiplier 108 has a plurality of multiplying stages, at least one of the plurality of multiplying stage having a multiplier dopant concentration, the doped multiplier stage substantially depleted during operation.

The avalanche photodiode has a diffusion block 110. Diffusion block 10 is about 2000 Å of intrinsic InGaAs. Diffusion block 10 is adjacent to anode 102. Anode 102 is about 8000 Å of intrinsic InP. Anode 102 is adjacent to multiplier 108, the multiplier describe further in detail hereinbelow. Multiplier 108 is adjacent to an absorber 106. Absorber 106 is about 15,000 Å of intrinsic InGaAs. Absorber 106 is adjacent to cathode 104. Cathode 104 is 4000 Å with n-dopant concentration of about 5E18. Cathode 104 is adjacent to a substrate 112. Here the substrate is n-type InP.

Here, doped multiplier 108 has ten multiplication stages, nine of which are a 9-times repeated structure. A first field-down layer 114 has about 200 Å of InP with p-dopant concentration of about 1E18. Next, the 9-times repeated structure comprise, in order, a field-up layer 116, a multiplication layer 118, an energy relaxation layer 120, and a field-down layer 124. Field-up layer 116 is about 200 Å of intrinsic InP. Multiplication layer 118 is about 2000 Å of InP with n-dopant concentration of about 1E17. The other multiplication stage comprises a field up layer 124 and a multiplication layer 126. Energy relaxation layer 122 is about 600 Å of intrinsic IP. Here, all the multiplication layers are doped.

The field-down layers are doped such that the electric field is reduced and the field up layers are lightly doped to increase electric field strength, effectively setting the relative field strength in the multiplication layers and relaxations layers. The energy relaxation layers reset dead space of active carriers exiting multiplication layers and minimize the likelihood that those active carriers will impact-ionize before losing accumulated kinetic energy to non-ionizing scattering processes, thereby increasing localization of the ionization events to the multiplication layers and further reducing the impact ionization rate of the carrier polarity with least propensity to impact ionize in the semiconductor alloy from which the multiplication stage is fabricated (here electrons). The repeating field-up and the field-down layers, with the multiplication layers and relaxation layers between, create a cascaded multiplying stages within the multiplier allowing increased net gain dependent on the number of the multiplication stages implemented. As shown, avalanche photodiode 100 has a gain of M=104.3, excess noise factor of F-20.1, effective electron to hole ionization ratio of k=0.178, with a maximum electric field strength of 532 kV/cm.

Figure 5:
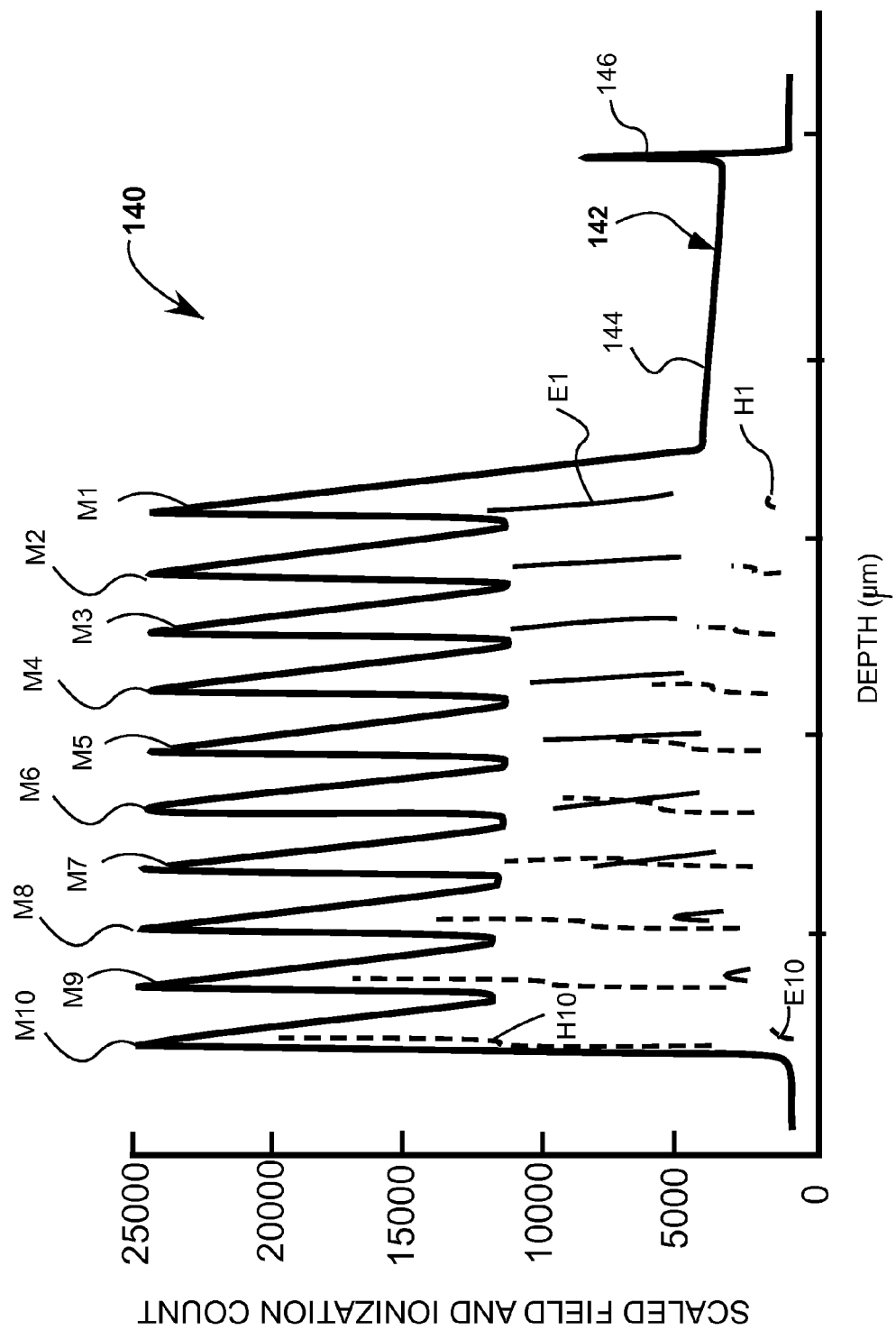
FIG. 5 is a graph of a scaled electric field an ionization count verse device depth of the avalanche photodiode shown in FIG. 4.

FIG. 5 is a graph 140 of a scaled field and an ionization count versus depth below the surface of the epitaxial layer structure of the avalanche photodiode as that seen in FIG. 4. An electric field 142 has minor spike 146 between the cathode and the absorber due to material transition. A low electric field 144 is associated with the absorber of the avalanche photodiode. Electric field 142 has a strong electric field profile M1, M2, M3, M4. M5, M6, M7, M8, M9, and M10. Each of the strong electric field profiles have an asymmetric shape, thereby increasing carrier ionization contrast.

The strong electric field profiles each have a hole and an electron ionization count. Here, exemplary strong electric field profile M1 has an electron ionization count E1 and a hole ionization count H1 and exemplary strong field profile M10 has an electron ionization count E10 and a hole ionization count H10. Due to the opposite direction of drift of electrons and holes, and to the exponential growth of carrier count which results from repeated multiplication of the total as a group of either carrier type passes through successive multiplying stages, electron ionization count E1 is greater than H1 and hole ionization count H10 is greater than E10.

Figure 6:
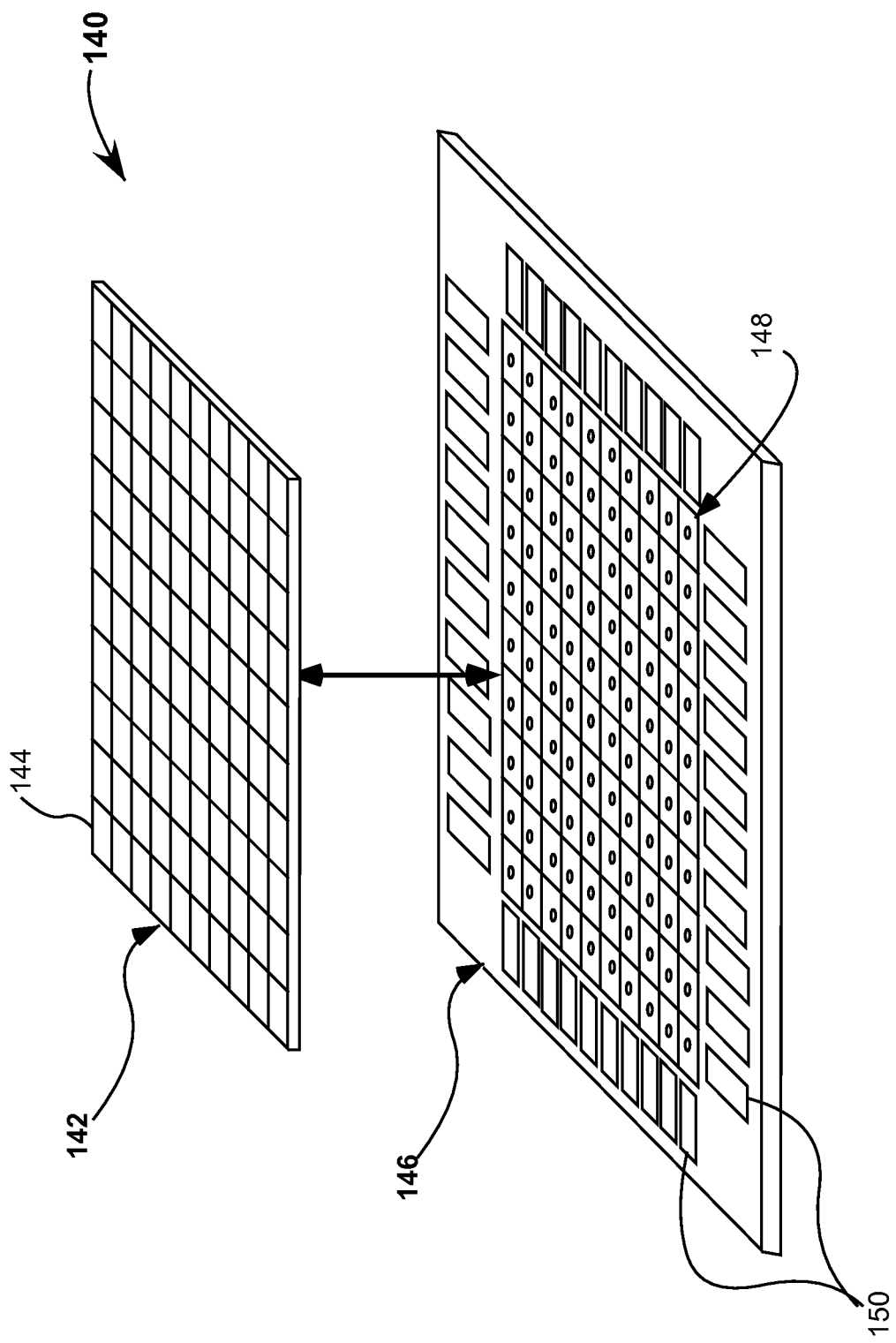
FIG. 6 a perspective view of an imaging device comprising a plurality of pixels, at least a portion of the pixels comprising an anode, a cathode, an absorber, and a doped multiplier, wherein the doped multiplier has a multiplier dopant concentration, the doped multiplier substantially depleted during operation.

In accordance with the present disclosure, the avalanche photodiode and various embodiments described can be used in an array to form an imaging device. Referring to FIG. 6 an imaging device 140 comprises of an pixel array 142. At least one of the pixels, for instance an exemplary pixel 144, comprise an anode, a cathode, an absorber, and a doped multiplier. The doped multiplier substantially depleted during operation. An imaging device may further comprise of a readout integrated circuit (ROIC) 146. The ROIC has a grid of electrical connections 148 to bond to pixel array 142 thereby having electrical communication to each of the pixels of the pixel array. The ROIC also has bonding pads 150 to allow electrical connections, via wire bonding, for instance, to external packaging.

The ROIC comprises of integrated circuitry optimized for particular applications. The ROIC may comprise of a capacitive transimpedance amplifier, and may be optimized for imaging application. In order to pixelate the avalanche photodiode of the present disclosure, a variety of pixelating techniques can be implemented. Both FIG. 7 and FIG. 8 along with the discussion below provide two nonlimiting examples of such pixelating techniques.

Figure 7:
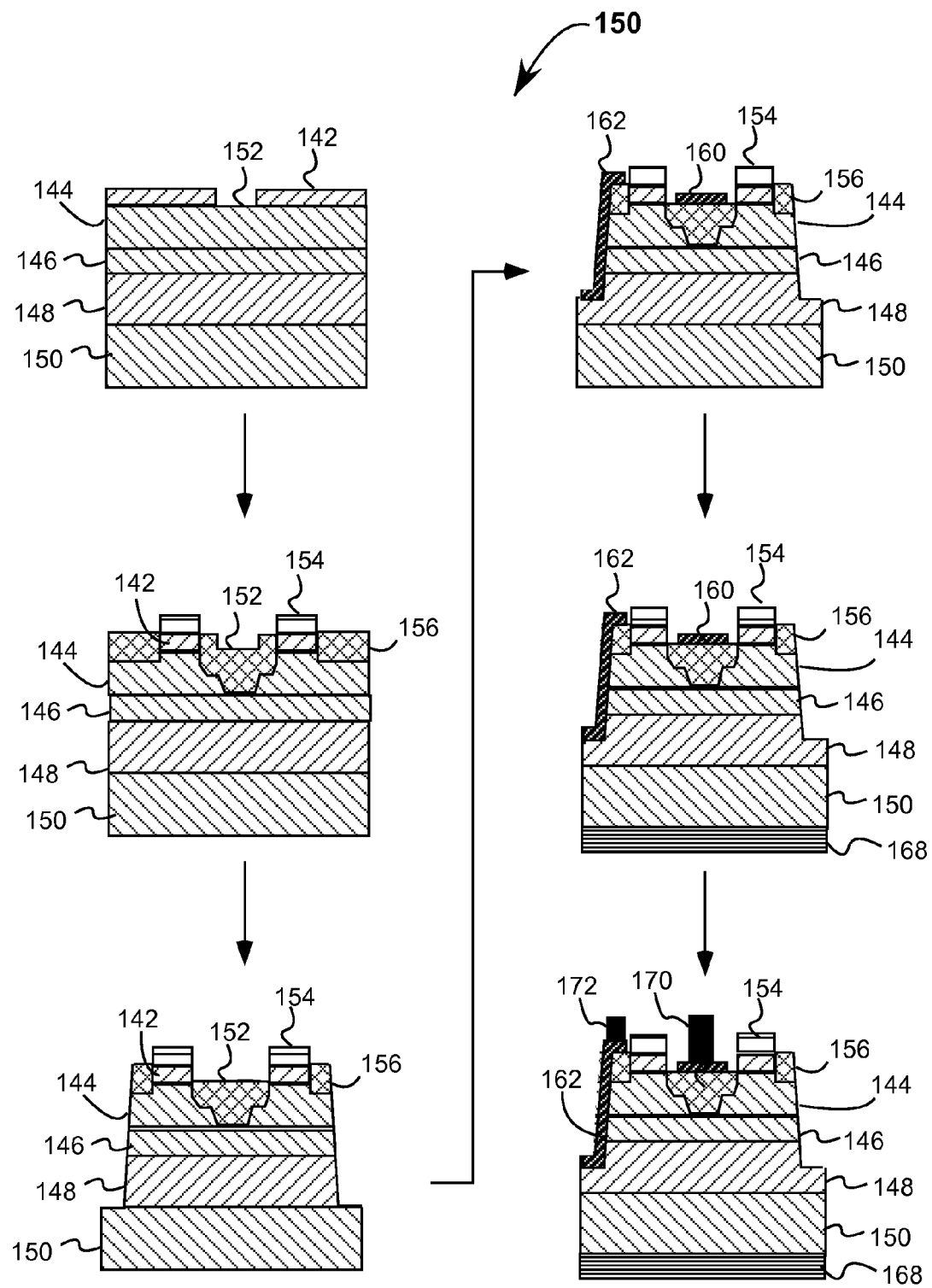
FIG. 7 is a cross-section view illustrating a method to pixelate an avalanche photodiode structure.

FIG. 7 schematically illustrates a method 140 of pixelating the avalanche photodiode structure of the present disclosure. Starting with a structure comprising a diffusion block 142, an anode 144, a doped multiplier 146, an absorber 148, and a cathode 150, an anode well 152 is etched through diffusion block 142 exposing a portion of anode 144.

Next a diffusion mask 154 is deposited then patterned. Dopant atoms are then diffused into the semiconductor through openings in the diffusion mask. In general, the concentration profile of the diffused dopant atoms should be controlled to drop substantially at about the multiplier 146.

Next, the diffusion block is stripped and a cathode trench is formed to reach cathode 148. The cathode trench is preferably removed laterally from the detector pixel since the etch will run laterally, and since high carrier recombination rates obtain at the trench sidewall which can result in extra dark current generation if located within a few carrier diffusion lengths of the edge of the junction. Next, an anode contact metallization 160 and a cathode metallization 162 is deposited. Optionally the substrate is thinned and polished and an antireflection coating (AR) 168 is deposited. Last an anode bump 170 and a cathode bump 172 is deposited onto the anode and cathode, respectively, to allow bump bonding to the ROIC.

Figure 8:
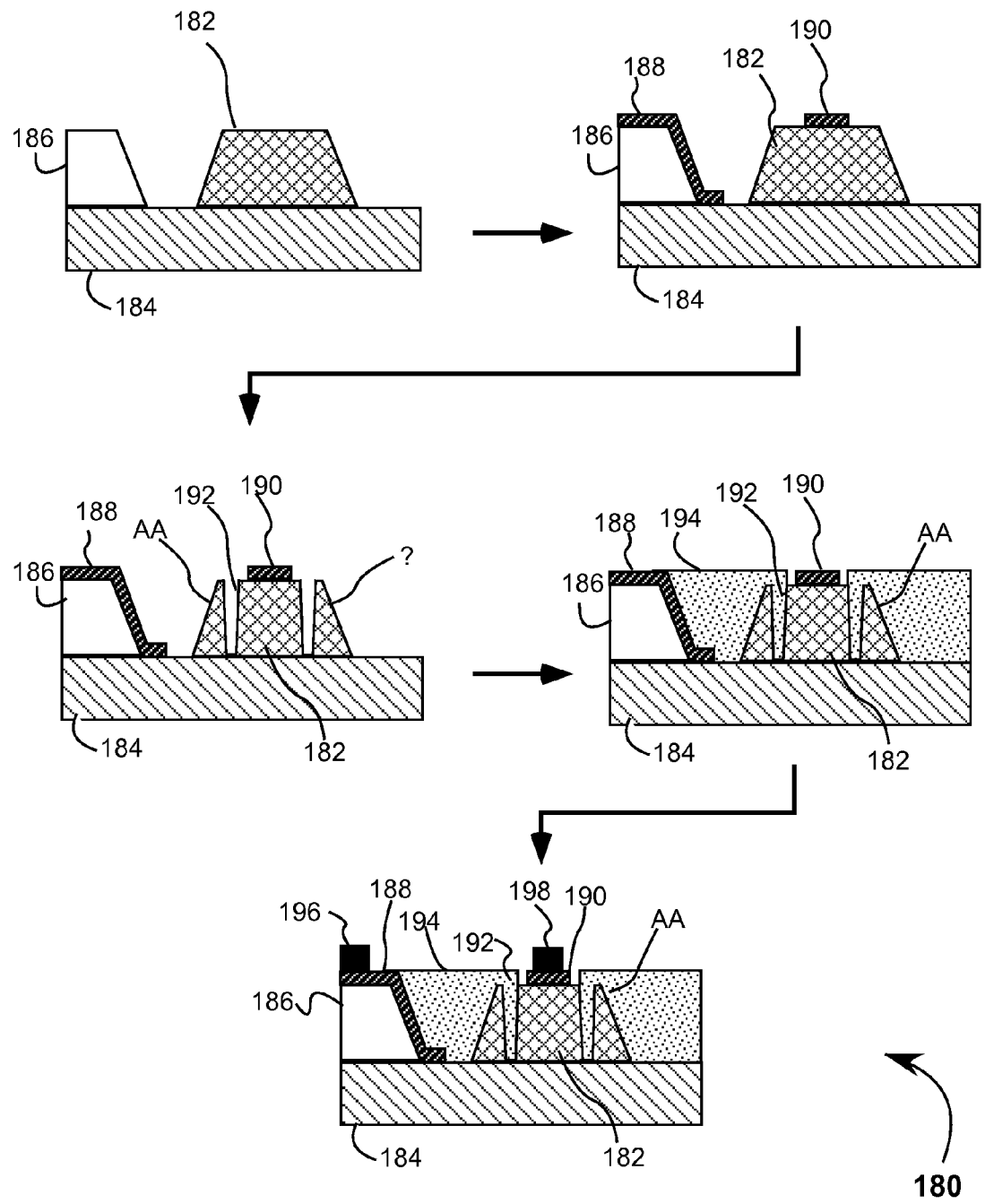
FIG. 8 is a cross-section view illustrating another method to pixelate an avalanche photodiode structure.

FIG. 8 schematically illustrates another method 180 of pixelating the avalanche photodiode structure of the present disclosure, wherein a physical trench etched through the APD's epitaxial layers is employed to isolate the pixel. The method is exemplified in a single pixel. The avalanche photodiode comprising the anode, the cathode, the absorber, and the multiplier is represented as an aggregate avalanche photodiode structure 182. Structure 182 is on a substrate 184. Also shown is the edge of the wafer 186. Initially, a wet chemical etch process is used to form a trench around the structure to provide access to the cathode layer's surface 182. Next a cathode metal contact 188 and an anode metal contact 190 are deposited. Here, cathode metal contact is shown deposited at the edge of the wafer 186, the cathode common to all the pixels in the array. Both the anode and the cathode contact functions may be performed by the same metal stack or different metal stacks which are optimized for low contact resistance to anode or cathode may be employed. Both contact metal stacks may optionally include under-bump metal layers to facilitate subsequent indium bump-bonding to a ROIC.

Next, an isolation trench 192 is formed around the pixel structure further. The fresh isolation trench is formed after contact metallization in order to expose a chemically clean sidewall surface with as few morphological defects as possible, to minimize dark current. Next, the surface is chemically passivated by a treatment that replaces in-bandgap energy states with chemical bonds that lie outside the semiconductor bandgap, and a polymer 194 is deposited to encapsulate the passivated surface to protect it from environmental degradation. Last, optionally, cathode solder bumps 196 and anode solder bumps 198 are deposited to allow bonding to a ROIC.

The present embodiments and methods described in the present disclosure have a variety of useful applications. For instance, the avalanche photodiode can be used as a single photodiode or in a pixelated array. The avalanche photodiode is especially well suited for low-light imaging applications.

From the description of the present disclosure provided herein one skilled in the art can manufacture apparatus and practice the methods disclosed in accordance with the present invention. While the present invention has been described in terms of particular embodiments and examples, others can be implemented without departing from the scope of the present invention. In summary, the present disclosure above describes particular embodiments. The invention, however, is not limited to the embodiments described and depicted herein. Rather, the invention is limited only by the claims appended hereto.

What is claimed is:

1. An epitaxial grown avalanche photodiode, the avalanche photodiode comprising:
   an anode;
   a cathode;
   an absorber; and
   a doped multiplier, the doped multiplier having a multiplier dopant concentration profile, the doped multiplier concentration profile intentionally doped with at least ten times any unintentional background doping but with doping low enough to allow full depletion of the doped multiplier at reverse bias such that when a reverse bias is applied, an asymmetric electric field is present as measured down the axis of the avalanche photodiode between the anode and the cathode and the doped multiplier is depleted, wherein the absorber and the doped multiplier are between the cathode and the anode.

2. The avalanche photodiode of claim 1, wherein the absorber is not intentionally doped.

3. The avalanche photodiode of claim 1, further comprising a graded heterojunction between the multiplier and the absorber.

4. The avalanche photodiode of claim 1, further comprising an intentionally doped charge layer or field control.

5. The avalanche photodiode of claim 1, wherein the doped multiplier is adjacent to the anode.

6. The avalanche photodiode of claim 1, wherein the doped multiplier is adjacent to the cathode.

7. The avalanche photodiode of claim 1, wherein the doped multiplier is made from materials including binary semiconductor compounds such as indium arsenide (InAs), gallium arsenide (GaAs), aluminum arsenide (AlAs), indium phosphide (InP), gallium phosphide (GaP), aluminum phosphide (AlP), indium antimonide (InSb), gallium antimonide (GaSb), aluminum Antimonide (AlSb), and ternary or quaternary compounds formed by selected combinations of those binary compounds.

8. The avalanche photodiode of claim 1, wherein the dopant material is from beryllium (Be), carbon (C), magnesium (Mg), zinc (Zn), cadmium (Cd), silicon (Si), germanium (Ge), or other dopant species which function as electron acceptors, resulting in the doped multiplier being p-type.

9. The avalanche photodiode of claim 1, wherein the dopant material is from sulfur (S), selenium (Se), Tellurium (Te), silicon (Si), germanium (Ge), or other dopant species which function as electron donors, resulting in a n-type doped multiplier.

10. The avalanche photodiode of claim 1, wherein the absorber is doped, the doped absorber having an absorber doping concentration profile along an axis of epitaxial layer growth, the absorber doping concentration profile decreasing in the direction of the doped multiplication region, the doped absorber undepleted during operation.

11. The avalanche photodiode of claim 10, wherein the absorber doping concentration profile is exponentially decreasing.

12. The avalanche photodiode of claim 10, wherein the absorber comprises a plurality of layers, each of the layers having a different dopant concentration, the layer's thicknesses and the dopant concentration creating the decreasing doping concentration profile.

13. The avalanche photodiode of claim 10, wherein the absorber gradient doping profile exponentially decreases.

14. An imaging device, the imaging device comprising:
   a plurality of pixels, at least a portion of the pixels comprising an anode, a cathode, and a doped multiplier; and
   wherein the doped multiplier has a multiplier dopant concentration profile, the doped multiplier concentration profile intentionally doped with at least ten times any unintentional background doping but with doping low enough to allow full depletion of the doped multiplier at reverse bias such that when a reverse bias is applied, an asymmetric electric field is present as measured down the axis of the avalanche photodiode between the anode and the cathode and, the doped multiplier is depleted during operation, and wherein the absorber and the multiplier are between the cathode and the anode.

15. The imaging device of claim 14, further comprising a readout integrated circuit (ROIC).

16. The imaging device of claim 15, wherein the readout integrated circuit is optimized for imaging applications.

17. The imaging device of claim 15, wherein the readout integrated circuit comprises a capacitive transimpedance amplifier.

* * * * *